US008680628B2

United States Patent
Doris et al.

(10) Patent No.: US 8,680,628 B2
(45) Date of Patent: Mar. 25, 2014

(54) RAISED SOURCE/DRAIN FIELD EFFECT TRANSISTOR

(71) Applicant: International Business Machines Corporation, Armonk, NY (US)

(72) Inventors: Bruce B. Doris, Brewster, NY (US); Kangguo Cheng, Guilderland, NY (US); Ali Khakifirooz, Slingerlands, NY (US); Pranita Kulkarni, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 13/655,610

(22) Filed: Oct. 19, 2012

(65) Prior Publication Data
US 2013/0043520 A1 Feb. 21, 2013

Related U.S. Application Data

(63) Continuation of application No. 12/848,494, filed on Aug. 2, 2010.

(51) Int. Cl.
*H01L 27/088* (2006.01)

(52) U.S. Cl.
USPC .......... 257/401; 257/288; 257/368; 257/347; 257/E27.06

(58) Field of Classification Search
USPC ......... 257/382, 296, 368, 401, 350, 347, 288, 257/E27.06
See application file for complete search history.

(56) References Cited

U.S. PATENT DOCUMENTS

| | | | |
|---|---|---|---|
| 6,127,233 A | 10/2000 | Rodder | 438/300 |
| 6,734,109 B2 | 5/2004 | Park et al. | 438/700 |
| 6,864,540 B1 | 3/2005 | Divakaruni et al. | 257/368 |
| 7,129,548 B2 | 10/2006 | Chan et al. | 257/382 |
| 7,652,332 B2 | 1/2010 | Cartier et al. | 257/347 |
| 7,843,016 B2 * | 11/2010 | Anderson et al. | 257/386 |
| 8,093,130 B2 * | 1/2012 | Kawakita | 438/300 |
| 8,236,679 B2 * | 8/2012 | Sakamoto et al. | 438/595 |
| 8,362,542 B2 | 1/2013 | Kang et al. | 257/315 |
| 8,518,758 B2 | 8/2013 | Yang et al. | 438/151 |
| 2009/0140313 A1 * | 6/2009 | Joo | 257/314 |
| 2009/0315120 A1 | 12/2009 | Shifren et al. | 257/386 |
| 2011/0175164 A1 * | 7/2011 | Bedell et al. | 257/347 |

OTHER PUBLICATIONS

K. Cheng, et al, "Fully Depleted Extremely Thin SOI Technology Fabricated by a Novel Integration Scheme Featuring Implant-Free, Zero-Silicon-Loss, and Faceted Raised Source/Drain", 2009 Symposium on VLSI Technology of Digest of Technical Papers, (2 pages).
Mark Rodder, "Raised Source/Drain MOSFET with Dual Sidewall Spacers", IEEE Electron Device Letters, vol. 12, No. 3, Mar. 1991, (pp. 89-91).

\* cited by examiner

*Primary Examiner* — Tom Thomas
*Assistant Examiner* — Benjamin Tzu-Hung Liu
(74) *Attorney, Agent, or Firm* — Harrington & Smith; Louis J. Percello

(57) ABSTRACT

In one exemplary embodiment of the invention, a semiconductor structure includes: a substrate; and a plurality of devices at least partially overlying the substrate, where the plurality of devices include a first device coupled to a second device via a first raised source/drain having a first length, where the first device is further coupled to a second raised source/drain having a second length, where the first device comprises a transistor, where the first raised source/drain and the second raised source/drain at least partially overly the substrate, where the second raised source/drain comprises a terminal electrical contact, where the second length is greater than the first length.

17 Claims, 6 Drawing Sheets

RAISED SOURCE/DRAIN FIELD EFFECT TRANSISTOR

CROSS-REFERENCE TO RELATED APPLICATION

This is a continuation of U.S. patent application Ser. No. 12/848,494, filed Aug. 2, 2010.

TECHNICAL FIELD

The exemplary embodiments of this invention relate generally to semiconductor structures and, more specifically, relate to field effect transistors having a raised source/drain.

BACKGROUND

Field effect transistors (FETs) have inherent device resistance, including parasitic resistances, which may be modeled as a resistor in series with the switch. Performance depends upon how fast the circuit can charge and discharge the capacitive load, i.e., the circuit's switching speed. Device resistances limit current supplied by a particular device and slow capacitive switching. Thus, how fast the circuit switches the particular load depends both upon device on-current (e.g., which is selected by design) and the device resistances. Thus, circuit performance is maximized by maximizing device on-current and minimizing unwanted device resistance.

Another design concern is that, as FET features have shrunk, what are collectively known as short channel effects have become more pronounced, resulting in a rapid increase of static power consumption. Short channel effects have occurred, in part, from a threshold voltage reduction as the FET gate length is reduced. Such threshold voltage dependence on gate length, also known as threshold voltage roll-off, has been mitigated by thinning the transistor gate insulator (e.g., silicon oxide ($SiO_2$), a high-K dielectric). Unfortunately, especially as FET features have shrunk, thinner gate insulator has resulted in increased gate leakages or gate induced leakages (e.g., gate to channel, gate to source or drain and gate induced drain leakage (GIDL)). Therefore, for circuits with transistor gate lengths shorter than 100 nm, the circuit stand-by power has become comparable to the active power.

Short channel effects are known to improve inversely with channel thickness. For silicon on insulator (SOI) semiconductor devices, sub-threshold leakage and other short channel effects have been controlled and reduced by thinning the surface silicon layer, i.e., the device channel layer. Fully depleted (FD) devices (e.g., FDSOI devices) or partially depleted (PD) devices (e.g., PDSOI devices) have been formed in ultrathin SOI and/or extremely-thin SOI (ETSOI), for example, where the silicon channel layer is less than 50 nm or, in some cases, less than 20 nm. Ultrathin FDSOI devices operate at lower effective voltage fields. Additionally, these ultrathin SOI layers can be doped for higher mobility, which in turn increases device current and improves circuit performance. Furthermore, ultrathin FDSOI devices have a steeper sub-threshold current swing with current falling off sharply as the gate to source voltage drops below the threshold voltage.

Unfortunately, however, forming source/drain (S/D) regions that are made from the same ultrathin silicon layer increases external resistance and, in particular, contact resistance. Similar high resistance S/D diffusion and contact problems have been encountered in bulk silicon complementary metal oxide semiconductor (CMOS) devices with lightly doped drain (LDD) devices, where the S/D regions are maintained very shallow for lower voltage operation. Silicide has been tried to reduce this external resistance but has not been problem free. Especially for these very short devices, unless the S/D silicide is spaced away from the gate, the silicide can cause gate to channel or S/D shorts, for example. In addition, silicide can interfere or interact with high-K gate dielectric formation and vice versa.

BRIEF SUMMARY

In one exemplary embodiment of the invention, a semiconductor structure comprising: a substrate; and a plurality of devices at least partially overlying the substrate, where the plurality of devices comprises a first device coupled to a second device via a first raised source/drain having a first length, where the first device is further coupled to a second raised source/drain having a second length, where the first device comprises a transistor, where the first raised source/drain and the second raised source/drain at least partially overly the substrate, where the second raised source/drain comprises a terminal electrical contact, where the second length is greater than the first length.

In another exemplary embodiment of the invention, a method comprising: forming a plurality of devices at least partially overlying a substrate, where the plurality of devices comprises a first device and a second device, where the first device comprises a transistor; and forming a first raised source/drain and a second raised source/drain, where the first raised source/drain and the second raised source/drain at least partially overly the substrate, where the first device is connected to the second device via the first raised source/drain, where the first device is further coupled to the second raised source/drain, where the first raised source/drain has a first length and the second raised source/drain has a second length, where the second raised source/drain comprises a terminal electrical contact, where the second length is greater than the first length.

In a further exemplary embodiment of the invention, a logic gate structure comprising: a substrate; a plurality of transistors fabricated on the substrate, where the plurality of transistors comprises a first transistor, a second transistor and a third transistor that are serially connected with the first transistor coupled to the second transistor which is coupled to the third transistor, where a first end of the first transistor is coupled to an output and a second end of the first transistor is coupled to a first end of the second transistor, where a first end of the third transistor is coupled to a second end of the second transistor and a second end of the third transistor is coupled to ground, where the plurality of transistors further comprises a fourth transistor, a fifth transistor and a sixth transistor that are connected in parallel, where a first end of the fourth transistor, a first end of the fifth transistor and a first end of the sixth transistor are coupled to at least one voltage source, where a second end of the fourth transistor, a second end of the fifth transistor and a second end of the sixth transistor are coupled to the output; a plurality of first raised source/drain structures coupled to the fourth transistor, the fifth transistor, the sixth transistor, the first end of the first transistor and the second end of the third transistor, where the plurality of first raised source/drain structures has a first length; and a plurality of second raised source/drain structures coupled to the first end of the second transistor and the second end of the second transistor, where the plurality of second raised source/drain structures has a second length, where the second length is less than the first length.

BRIEF DESCRIPTION OF THE SEVERAL VIEWS OF THE DRAWINGS

The foregoing and other aspects of embodiments of this invention are made more evident in the following Detailed Description, when read in conjunction with the attached Drawing Figures, wherein.

DETAILED DESCRIPTION

Figure 1:
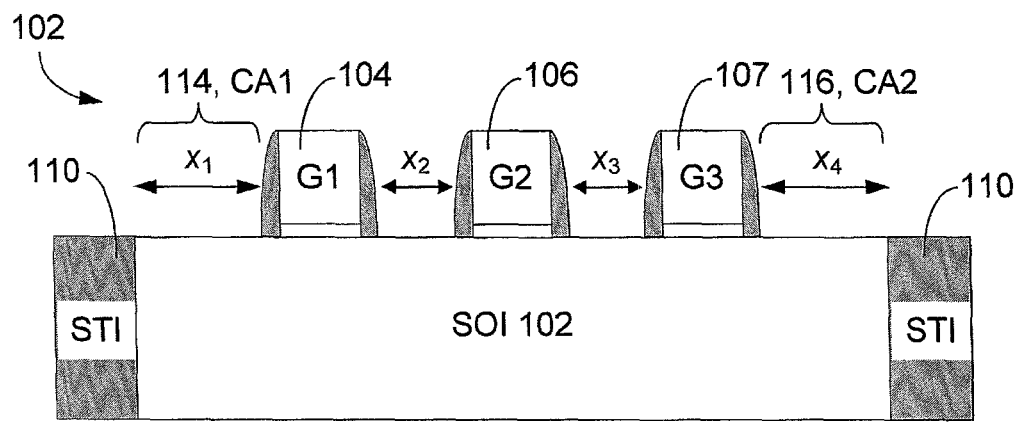
FIGS. 1-5 illustrate an exemplary method of fabricating semiconductor devices in accordance with the exemplary embodiments of the invention.

Another approach that has been used to reduce the external resistance is to selectively thicken the surface silicon layer adjacent to the device gates (e.g., using selective epitaxial silicon growth/deposition) to produce raised source/drain (RSD) regions. The thicker silicon RSD regions have a larger cross-sectional area for lower resistance per unit area (sheet resistance) and, thus, are effective in overcoming the external resistance problem. However, thickening the silicon layer to form RSD regions has also suffered from inadequate isolation and has further suffered from an increase in source to drain shorts.

As metal oxide semiconductor field effect transistors (MOSFETs) scale down in size, higher performance can be achieved by bringing metal silicide contacts closer to the gate conductor. There are difficulties, however, in forming self-aligned metal silicide contacts close to the gate conductor edge. For example, relatively thick silicides (e.g., on the order of about 20 nm or greater), which may be required to meet sheet resistivity in the diffusion and polycide, may consume silicon and interfere with the integrity of an ultra shallow junction that is typically present near the gate edge under the spacer.

For ultrathin MOSFETs in which the device channel has a thickness of about 20 nm or less, the thickness of the silicon available to form a silicide contact is limited. RSD regions can mitigate this problem, however RSD regions that are positioned close to the gate conductor edge will increase the capacitance between the gate and the source/drain regions. RSD structures may also be used to reduce junction leakage.

Thus, while RSD structures are often utilized, particularly for ultrathin MOSFETs, to reduce series or parasitic resistance or junction leakage, generally they lead to increased capacitance (e.g., increased parasitic capacitance). As compared to vertical RSD structures, faceted RSD structures may be used to lower the parasitic capacitance.

In view of the above, it is desirable to provide an improved semiconductor device (e.g., for thin MOSFETs) having RSD structures that enable further reductions in overall parasitic capacitance. Various exemplary embodiments of the invention enable such reductions in parasitic capacitance by controlling the spacing (e.g., contact-to-gate spacing and/or gate-to-gate spacing) so as to provide improvements over prior art semiconductor devices.

In some exemplary embodiments, a self-limiting faceted epitaxy process is used to form faceted RSD structures that may be triangle-shaped (e.g., generally, substantially, about or almost triangle-shaped or triangular), for example. The parasitic capacitance for such RSD structures is dependent, at least in part, on the height of the RSD structures. Thus, the height of the triangle, and the parasitic capacitance, depends on the S/D area available for RSD growth. For device terminals that need contact area (CA) space (such as one or more output nodes of logic gates, for example), increased source/drain area is used to provide enough room for silicide and CA. For device terminals that are not contacted (e.g., internal nodes/regions between gates that are not used for CA), the S/D area is kept to the minimum allowed by gate-to-gate spacing (e.g., non-contacted PP) to minimize the parasitic capacitance associated with these internal nodes.

It is noted that a contact area of a semiconductor structure is considered to be a space or region on the semiconductor structure that is intended to coupled the semiconductor structure to one or more other semiconductor structures, components or further devices (e.g., via a contact, a terminal contact, an electrical contact or a terminal electrical contact). Generally, it may be the case that the one or more other semiconductor structures, components or further devices are fabricated separately from the semiconductor structure.

FIGS. 1-5 illustrate an exemplary method of fabricating semiconductor devices in accordance with the exemplary embodiments of the invention. By way of example, the exemplary device shown is a three-transistor chain such is that used in a three-input NAND gate. In other exemplary embodiments, a different type of semiconductor structure may be fabricated. In other exemplary embodiments, the fabricated device may comprise additional or different kinds of structures (e.g., other than FETs). Furthermore, in other exemplary embodiments the device may comprise a different number of components (e.g., a different number of FETs) and/or a different arrangement of components (e.g., other than three FETs connected in series).

FIG. 1 shows an exemplary device 102 after formation of three FETS (a first gate structure (G1) 104, a second gate structure (G2) 106 and a third gate structure (G3) 108) and a shallow trench isolation (STI) 110 on a SOI substrate 112, but before formation of RSD structures. Note that for purposes of clarity the constituent layers or regions of the SOI substrate 112 are not shown (e.g., a thin, top layer of silicon (e.g., doped or undoped) overlying an insulating layer (e.g., buried oxide (BOX)) and a thicker, bottom layer of silicon (e.g., doped or undoped) underlying the insulating layer). The three gate structures G1 104, G2 106, G3 108 are arranged in series as shown in FIG. 1 with a first contact area (CA1) 114 between the G1 104 and the STI 110 and a second contact area (CA2) 116 between the G3 108 and the STI 110.

The regions between the individual components are identified in FIG. 1 as follows. There is a first region ($x_1$) from the STI 110 to the G1 104, a second region ($x_2$) from the G1 104 to the G2 106, a third region ($x_3$) from the G2 106 to the G3 108, and a fourth region ($x_4$) from the G3 108 to the STI 110. RSD structures will be formed in each of these four regions. The $x_1$ and $x_4$ regions correspond to the CA1 114 and the CA2 116, respectively, and may be referred to as CA contacts, CA regions or end terminals. The $x_2$ and $x_3$ regions may be referred to as internal contacts, internal regions or middle terminals. In some exemplary embodiments, the internal regions are not configured to form CA contacts (i.e., they are not configured to provide contacts that may connect or couple to other devices or components). The two end terminals ($x_1$ and $x_4$) are configured to connect and/or couple to other components and/or devices, such as other transistors, for example. In contrast, the middle terminals ($x_2$ and $x_3$) are not contacted.

As shown in FIG. 1, and in accordance with the exemplary embodiments of the invention, the CA regions ($x_1$ and $x_4$) have a greater distance (e.g., length, spacing, S/D length) than the internal regions ($x_2$ and $x_3$). As non-limiting examples, the CA regions may have a length on the order of 30 nm or so (i.e., approximately, substantially), while the internal regions may have a length on the order of 15 nm or so (i.e., approximately, substantially). In some exemplary embodiments, the internal region spacing is defined by (e.g., is a function of, is set to be, corresponds to) a minimum gate to gate spacing (e.g., in order to minimize the internal region length, which leads to a smaller RSD structure and reduced parasitic capacitance). In some exemplary embodiments, the CA region spacing is defined by (e.g., is a function of, is set to be, corresponds to) the contact to gate spacing such that, for example, $x_1 > x_2$. In some exemplary embodiments, $x_1 = x_4$ and/or $x_2 = x_3$.

Figure 2:
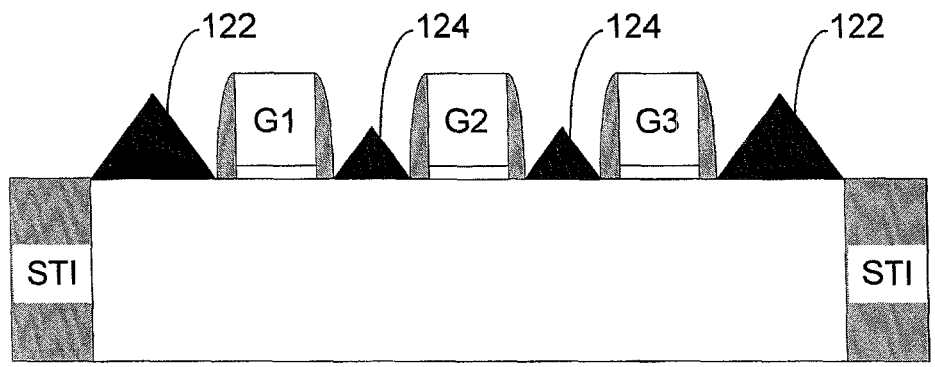

As shown in FIG. 2, RSD structures 122, 124 are formed on the device. In various exemplary embodiments, the RSD structures are formed by epitaxial deposition. In some exemplary embodiments, a faceted epitaxy is used to form the RSD structures 122, 124. With the small device dimensions as in the future technology nodes, the faceted epitaxy with reasonable thickness may form a generally triangle-shaped RSD structure. The height of the triangle is defined by (e.g., is a function of, corresponds to) the S/D length. Note that due to the CA regions having a greater length than the internal regions, the CA region RSD structures 122 are larger than the internal region RSD structures 124. In some exemplary embodiments, the RSD structures 122, 124 are doped in situ.

Figure 3:
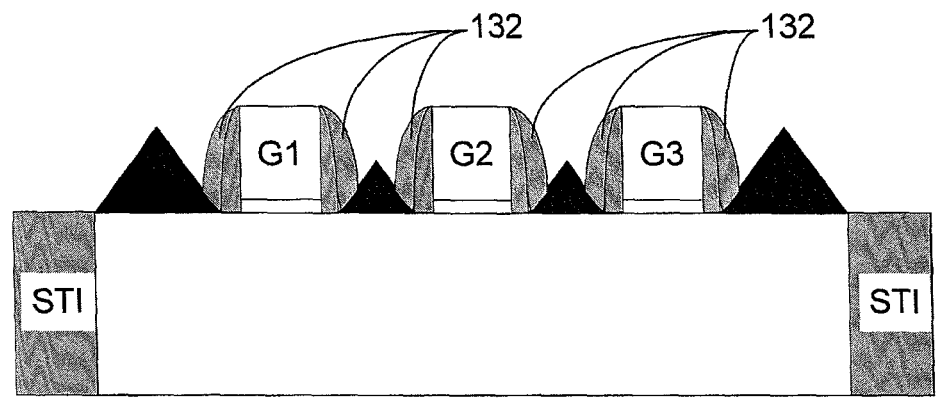

In FIG. 3, second spacers 132 are formed around each gate. The second spacers 132 may also be referred to as dual sidewall spacers, and may be useful in various respects. For example, the second spacers 132 can prevent S/D dopants from being implanted through any thinner faceted regions near the gate edge which might otherwise result in a junction depth in the silicon substrate that is deeper than desired. In addition, the second spacers 132 can prevent source to substrate silicide shorts through the thinner faceted regions near the gate edge. In some exemplary embodiments, the second spacers 132 are not formed or used. That is, the formation and usage of the second spacers 132 is optional.

Figure 4:
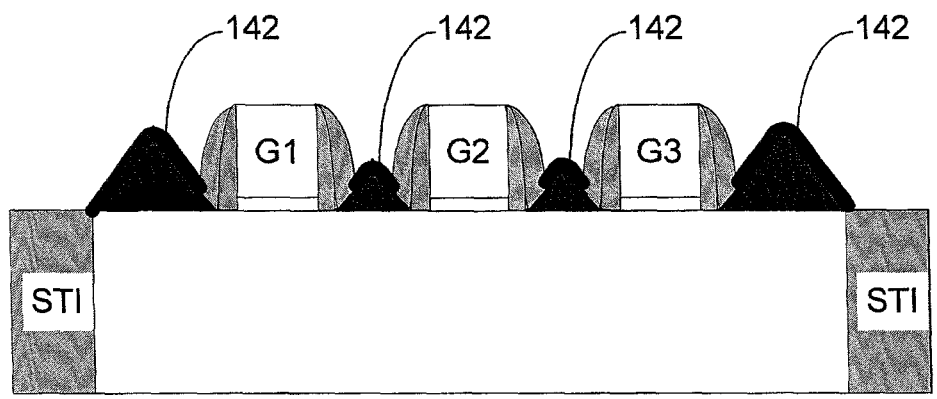

In FIG. 4, the RSD structures are silicided (i.e., covered with a layer of silicide 142). The silicide 142 helps to reduce the resistance for connections with, via or through the contacts. In some exemplary embodiments, only the CA regions are silicided (i.e., the internal regions are not silicided). In other exemplary embodiments, a different material (i.e., other than silicide) is used. In further exemplary embodiments, the regions are not silicided at al. That is, the formation and usage of silicide 142 is optional. Furthermore, in other exemplary embodiments different techniques or arrangements, such as silicide through trench (i.e., where silicide is formed at the bottom of the contact hole after the hole is formed), for example, may be utilized.

Figure 5:
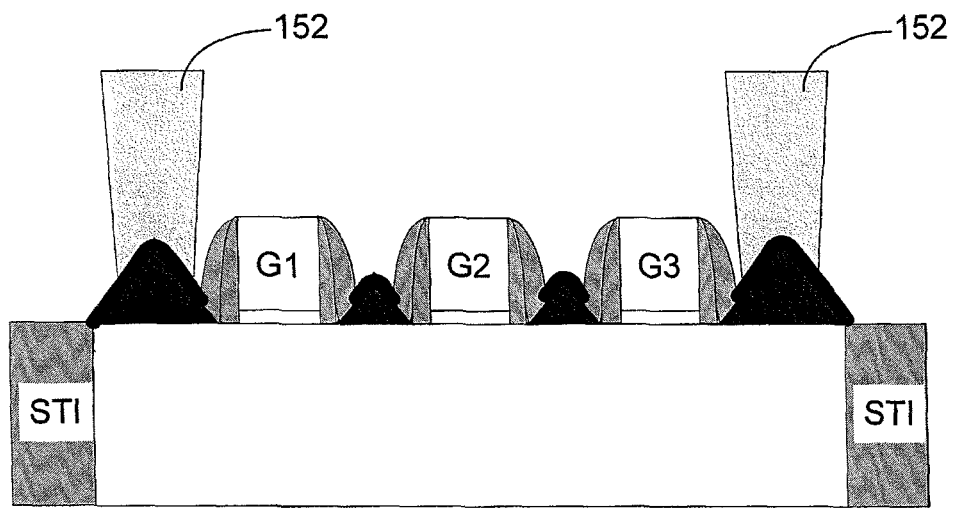

In FIG. 5, the contacts 152 are formed at the CA regions $x_1$, $x_4$. The contacts 152 are for connection and/or coupling to one or more other components, devices and/or structures (e.g., semiconductors, semiconductor structures, etc.).

Figure 6:
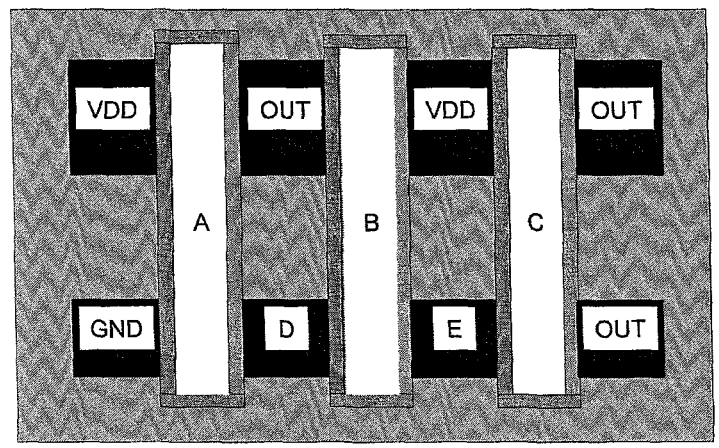
FIG. 6 shows a conventional transistor arrangement for a three-input NAND gate.

FIG. 6 shows a conventional transistor arrangement for a three-input NAND gate. As can be seen in FIG. 6, the conventional arrangement has the three inputs A, B, C evenly spaced across the entire arrangement. For example, generally regions E and F are the same size as the contacts (VDD, OUT, GND corresponding to voltage source, output and ground, respectively) even though regions E and F are not contacts and do not couple (e.g., electrically) to any external components. Thus, the gate-to-gate spacing is constant for all device terminals of the conventional structure shown in FIG. 6.

Figure 7:
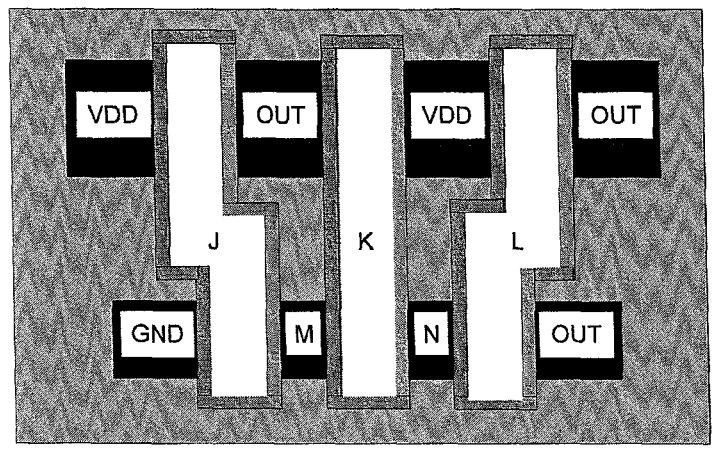
FIG. 7 illustrates an exemplary transistor arrangement for a three-input NAND gate in accordance with the exemplary embodiments of the invention.

FIG. 7 illustrates an exemplary transistor arrangement for a three-input NAND gate in accordance with the exemplary embodiments of the invention. As can be seen in FIG. 7, the exemplary arrangement utilizes different spacing for contacts (VDD, OUT, GND) than for non-contact regions (M, N). That is, the spacing (e.g., gate-to-gate spacing) of the exemplary device of FIG. 7 will vary depending on whether or not a contact is needed for the given space. In such a manner, and by way of example, exemplary embodiments of the invention enable reduction in parasitic capacitance by controlling the spacing (e.g., contact-to-gate spacing and/or gate-to-gate spacing) so as to provide improvements over prior art semiconductor devices (e.g., as shown in FIG. 6).

In some exemplary embodiments, the exemplary structure of FIG. 7 may require gate structures (J, K, L) to be non-parallel, which is generally not desirable in direct patterning. However, as technology develops a sidewall image transfer may be used to assist in the formation of the desired structure (e.g., the exemplary one shown in FIG. 7).

Figure 8:
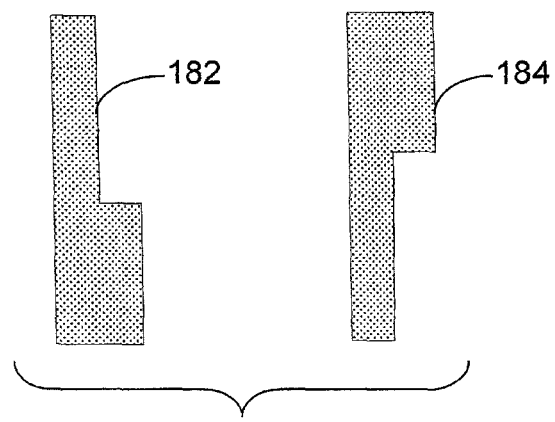
FIG. 8 depicts two exemplary mandrels that may be used in order to produce exemplary non-parallel gates.

FIG. 8 depicts two exemplary mandrels 182, 184 that may be used in order to produce exemplary non-parallel gates, such as those in the exemplary structure/arrangement shown in FIG. 7 (e.g., gate structures J, K, L).

Figure 9:
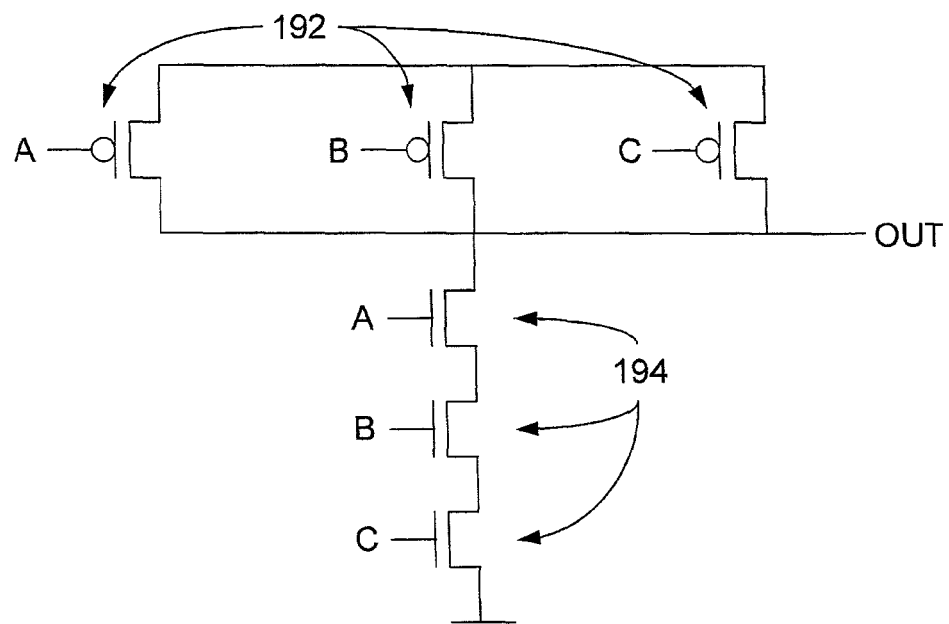
FIG. 9 shows a circuit schematic for an exemplary three-input NAND gate.

FIG. 9 shows a circuit schematic for an exemplary three-input NAND gate, such as the one shown in FIG. 7, for example. Three PFETs 192 are connected in parallel, while three NFETs 194 are in series. The three inputs are A, B and C. For the PFETs 192, both sides of the transistors will need a contact (one side to VDD, the other side to an output), while the internal nodes of the NFETs 194, being connected in series, will not need a contact.

Figure 10:
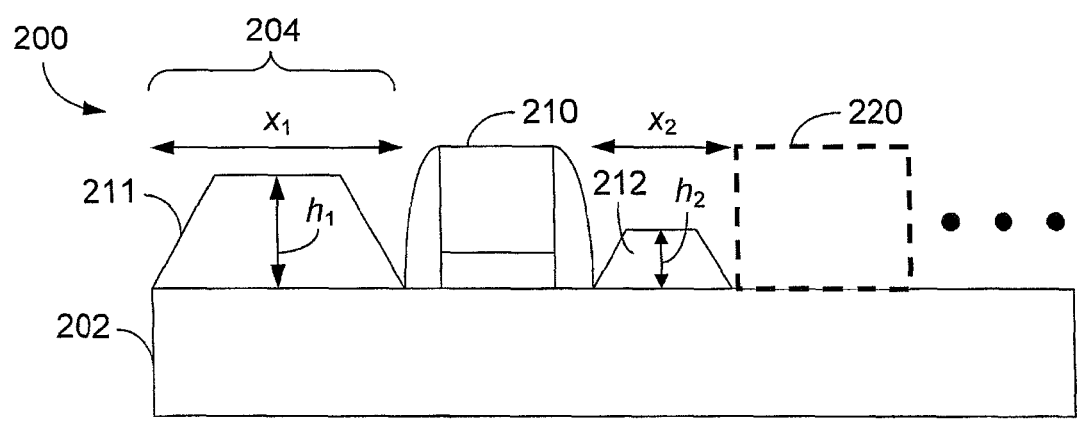
FIG. 10 shows a generalized exemplary semiconductor structure in accordance with the exemplary embodiments of the invention.

FIG. 10 shows a generalized exemplary semiconductor structure 200 in accordance with the exemplary embodiments of the invention. The structure 200 includes a transistor 210 and another device 220, both overlying (e.g., disposed on) a substrate 202. As non-limiting examples, the other device 220 may comprise another transistor (e.g., a transistor connected in series to the first transistor 210) or a passive device (e.g., a capacitor, a resistor, etc.). The transistor 210 is coupled to two RSD structures 211, 212, one on either side of the transistor 210. The first RSD 211 is located at a contact area 204 of the semiconductor 200 and has a base of length $x_1$ and a height $h_1$. The second RSD 212 is not located at a contact area and has a base of length $x_2$ and a height $h_2$. Note that $x_1 > x_2$ and $h_1 > h_2$. In some exemplary embodiments the length of the base and the height of the individual RSDs will be related to one another (e.g., via a mathematical relation, for example, if the RSD were generally triangular in cross-section). It will be noted in FIG. 10 that first RSD 211 and second RSD 212 each have a trapezoidal cross section.

It is noted that epitaxy (e.g., epitaxial or "epi" deposition of a layer, often referred to as the epitaxial or epi layer) refers to the formation of a layer on a crystalline surface, with the layer having the same symmetry and crystalline orientation as the crystalline surface. Typically, a single crystal lattice structure carries across an interface. Customarily in epitaxy, a single crystal or monocrystalline material forms a platform onto which another single crystal material with matching crystalline characteristics is deposited by one of several techniques known in the art. As non-limiting examples, such techniques include: ultrahigh vacuum chemical vapor deposition (UH-VCVD), rapid thermal chemical vapor deposition (RTCVD), metalorganic chemical vapor deposition (MOCVD), low-pressure chemical vapor deposition (LPCVD), limited reaction processing chemical vapor deposition (LRPCVD), plasma-enhanced chemical vapor deposition (PECVD) and molecular beam epitaxy (MBE).

In some exemplary embodiments of the invention the epitaxially deposited material matches the composition of the surface of the body (e.g., the surface of the underlying SOI substrate). For example, if the body is essentially Si, the epitaxially deposited material may be essentially/primarily Si. As a further example, if there is a Ge content at the surface, the epitaxially deposited material may match that Ge content. In an alternative exemplary embodiment of the invention, the composition of the epitaxially deposited material is different from the composition of the surface of the body. For example, if the body is essentially/primarily Si, the epitaxially deposited material may be SiGe or Si:C. During the epitaxy process, the epi layer can be in-situ doped with one or more dopants such as phosphorus, arsenic, boron, and/or indium, as non-limiting examples. Alternatively, the epi layer can be ex-situ doped by performing a doping process after the epitaxy process. The doping techniques may include, but are not limited to: ion implantation, gas phase doping, plasma doping, plasma immersion ion implantation, cluster doping, infusion doping, liquid phase doping, and solid phase doping One or multiple cleaning processes may be performed before the epitaxy process to remove oxygen or other undesired material from the surface of the exposed semiconductor material in order to improve the epitaxy quality. The cleaning processes may include, but are not limited to: etching in a solution containing hydrofluoric acid and plasma etching with fluorine-containing species. As non-limiting examples, such fluorine-containing species include: ammonia (NH3), nitrogen trifluoride (NF3), ammonia fluoride (NH4F), ammonium hydrogen fluoride (NH4F.HF), and ammonium hexafluorosilicate ((NH4)2SiF6). In addition or in the alternative, a hydrogen prebake process may be performed after the above cleaning process and before the actual start of the epitaxy. For example, the semiconductor substrate may be heated at a temperature ranging from 700° C. to 950° C. in a hydrogen containing environment (e.g., for 10 to 200 seconds). This can be performed in the epitaxy chamber right before the epitaxy process to further clean the (exposed) semiconductor surface.

Below are further descriptions of various non-limiting, exemplary embodiments of the invention. The below-described exemplary embodiments are numbered separately for clarity purposes. This numbering should not be construed as entirely separating the various exemplary embodiments since aspects of one or more exemplary embodiments may be practiced in conjunction with one or more other aspects or exemplary embodiments.

(1) In one exemplary embodiment of the invention, a semiconductor structure comprising: a substrate; and a plurality of devices at least partially overlying the substrate, where the plurality of devices comprises a first device coupled to a second device via a first raised source/drain having a first length, where the first device is further coupled to a second raised source/drain having a second length, where the first device comprises a transistor, where the first raised source/drain and the second raised source/drain at least partially overly the substrate, where the second raised source/drain comprises (e.g., is for) a terminal electrical contact, where the second length is greater than the first length.

A semiconductor structure as above, where the second device comprises a second transistor or a second field effect transistor. A semiconductor structure as in any above, where the second device comprises a passive device, a capacitor or a resistor. A semiconductor structure as in any above, where the first device comprises a field effect transistor. A semiconductor structure as in any above, where the second device is further coupled to a third device via a third raised source/drain having a third length, where the second length is greater than the third length. A semiconductor structure as in any above, where the third length is (about, approximately, substantially) equal to the first length.

A semiconductor structure as in any above, where the first raised source/drain is not for a contact (e.g., an electrical contact, the terminal electrical contact, another terminal electrical contact, any terminal electrical contact). A semiconductor structure as in any above, where the semiconductor structure comprises a NAND gate. A semiconductor structure as in any above, where the semiconductor structure comprises a three-input NAND gate. A semiconductor structure as in any above, where the first raised source/drain and the second raised source drain are formed by a faceted epitaxial deposition. A semiconductor structure as in any above, where the first length is (e.g., about, approximately) 15 nm. A semiconductor structure as in any above, where the second length is (e.g., about, approximately) 30 nm.

A semiconductor structure as in any above, further comprising silicide that is formed over at least the second raised source/drain. A semiconductor structure as in any above, where the difference in the first length and the second length is operable to reduce and/or minimize parasitic capacitance for the semiconductor structure (e.g., as caused by the first raised source/drain). A semiconductor structure as in any above, where at least one of the first raised source/drain and the second raised source drain comprises a generally triangular cross-section (e.g., a triangle-shaped raised source/drain, a generally, substantially, about or almost triangular shape). A semiconductor structure as in any above, where the first length is measured from the first transistor to the second transistor. A semiconductor structure as in any above, where the second length is measured from the first transistor to an end of a contact area.

A semiconductor structure as in any above, where the terminal electrical contact is operable to connect to another device or component. A semiconductor structure as in any above, where the first raised source/drain is not operable to connect to a further device or component. A semiconductor structure as in any above, where the gate-to-gate spacing for at least two devices of the plurality of devices is less than a length of at least one contact area on the semiconductor structure. A semiconductor structure as in any above, where the substrate comprises a silicon-on-insulator, a thin silicon-on-insulator, a partially depleted silicon-on-insulator, a fully depleted silicon-on-insulator or a bulk substrate. A semiconductor structure as in any above, where the first raised source/drain has a first height (e.g., as measured from a surface of the substrate) and the second raised source drain has a second height (e.g., as measured from the surface of the substrate), where the second height is greater than the first height. A semiconductor structure as in any above, further comprising one or more aspects of the exemplary embodiments of the invention as described herein.

(2) In another exemplary embodiment of the invention, and as shown in FIG. 10, a method (e.g., to fabricate a semiconductor device having a backside strap) comprising: forming a plurality of devices at least partially overlying a substrate, where the plurality of devices comprises a first device and a second device, where the first device comprises a transistor (501); and forming a first raised source/drain and a second raised source/drain, where the first raised source/drain and the second raised source/drain at least partially overly the substrate, where the first device is connected to the second device via the first raised source/drain, where the first device is further coupled to the second raised source/drain, where the first raised source/drain has a first length and the second raised source/drain has a second length, where the second raised source/drain comprises a terminal electrical contact, where the second length is greater than the first length (502).

A method as above, where forming the first raised source/drain and the second raised source/drain comprises performing a faceted epitaxy to deposit material. A method as in any above, further comprising: forming silicide over at least the second raised source/drain. A method as in any above, further comprising: forming a double spacer around the first device. A method as in any above, further comprising: forming a contact at the second raised source/drain. A method as in any above, further comprising one or more aspects of the exemplary embodiments of the invention as described herein. A semiconductor structure formed in accordance with any (e.g., any one) of the above methods.

(3) In a further exemplary embodiment of the invention, a logic gate structure comprising: a substrate; a plurality of transistors fabricated on the substrate, where the plurality of transistors comprises a first transistor, a second transistor and a third transistor that are serially connected with the first transistor coupled to the second transistor which is coupled to the third transistor, where a first end of the first transistor is coupled to an output and a second end of the first transistor is coupled to a first end of the second transistor, where a first end of the third transistor is coupled to a second end of the second transistor and a second end of the third transistor is coupled to ground, where the plurality of transistors further comprises a fourth transistor, a fifth transistor and a sixth transistor that are connected in parallel, where a first end of the fourth transistor, a first end of the fifth transistor and a first end of the sixth transistor are coupled to at least one voltage source, where a second end of the fourth transistor, a second end of the fifth transistor and a second end of the sixth transistor are coupled to the output; a plurality of first raised source/drain structures coupled to the fourth transistor, the fifth transistor, the sixth transistor, the first end of the first transistor and the second end of the third transistor, where the plurality of first raised source/drain structures has a first length; and a plurality of second raised source/drain structures coupled to the first end of the second transistor and the second end of the second transistor, where the plurality of second raised source/drain structures has a second length, where the second length is less than the first length.

A logic gate structure as above, where the logic gate structure comprises a three-input NAND gate. A logic gate structure as in any above, where the first transistor and the fourth transistor share (e.g., are activated by) a first gate, where the second transistor and the fifth transistor share (e.g., are activated by) a second gate, where the third transistor and the sixth transistor share (e.g., are activated by) a third gate. A logic gate structure as in any above, where the first transistor and the fourth transistor share (e.g., both receive) a first input, where the second transistor and the fifth transistor (e.g., both receive) share a second input, where the third transistor and the sixth transistor (e.g., both receive) share a third input. A logic gate structure as in any above, where the first transistor, the second transistor and the third transistor comprise NFETs, where the fourth transistor, the fifth transistor and the sixth transistor comprise PFETs. A logic gate structure as in any above, further comprising one or more aspects of the exemplary embodiments of the invention as described herein.

Figure 11:
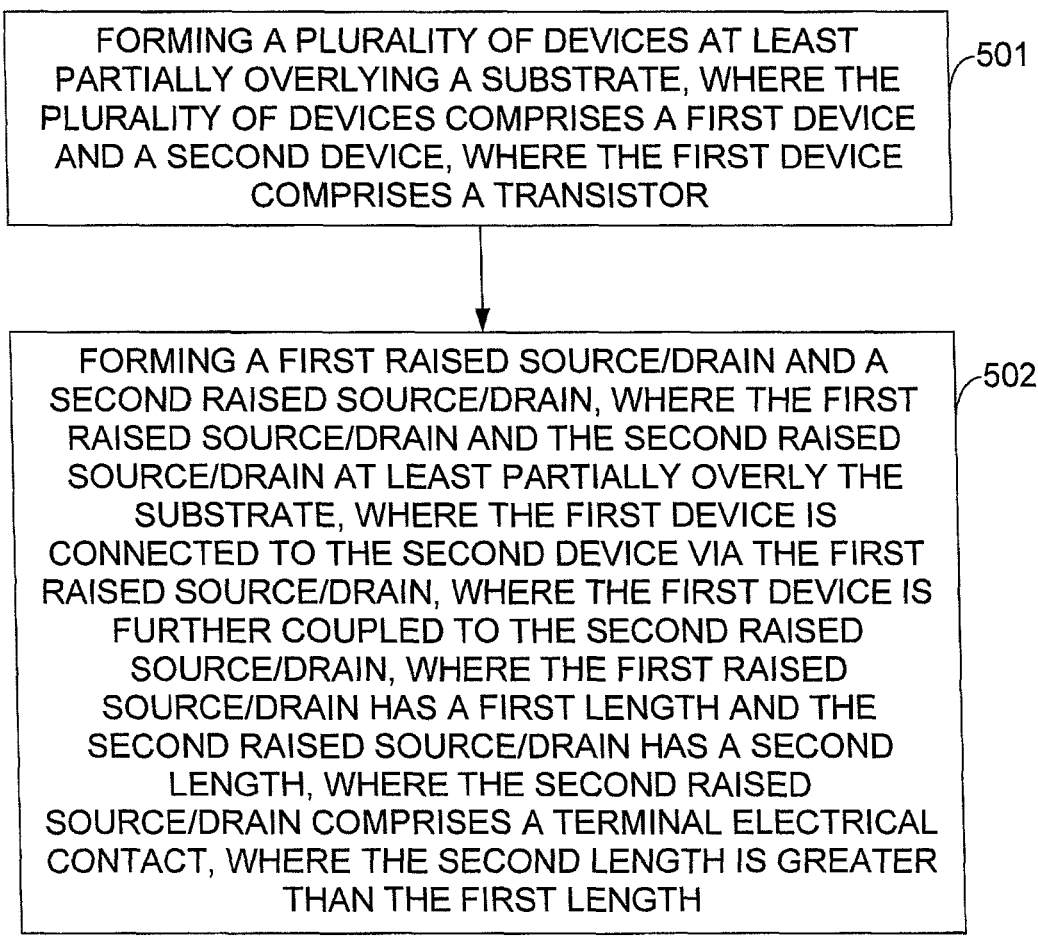
FIG. 11 depicts a flowchart illustrating one non-limiting example of a method for practicing the exemplary embodiments of the invention.

The blocks shown in FIG. 11 further may be considered to correspond to one or more functions and/or operations that are performed by one or more components, circuits, chips, apparatus, processors, computer programs and/or function blocks. Any and/or all of the above may be implemented in any practicable solution or arrangement that enables operation in accordance with the exemplary embodiments of the invention as described herein.

In addition, the arrangement of the blocks depicted in FIG. 11 should be considered merely exemplary and non-limiting. It should be appreciated that the blocks shown in FIG. 11 may correspond to one or more functions and/or operations that may be performed in any order (e.g., any suitable, practicable and/or feasible order) and/or concurrently (e.g., as suitable, practicable and/or feasible) so as to implement one or more of the exemplary embodiments of the invention. In addition, one or more additional functions, operations and/or steps may be utilized in conjunction with those shown in FIG. 11 so as to implement one or more further exemplary embodiments of the invention.

That is, the exemplary embodiments of the invention shown in FIG. 11 may be utilized, implemented or practiced in conjunction with one or more further aspects in any combination (e.g., any combination that is suitable, practicable and/or feasible) and are not limited only to the steps, blocks, operations and/or functions shown in FIG. 11.

The flowchart and block diagrams in FIG. 11 illustrate the architecture, functionality, and operation of possible exemplary implementations of systems, methods and products according to various exemplary embodiments of the invention. In this regard, each block in the flowchart or block diagrams may represent a module, segment or portion of code, which comprises one or more executable instructions for implementing the specified (logical) function(s). It should also be noted that, in some alternative exemplary implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The exemplary methods and techniques described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

The terminology used herein is for the purpose of describing particular exemplary embodiments only and is not intended to be limiting of the exemplary embodiments of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components and/or groups thereof.

Unless described otherwise herein, "depositing" may include any now known or later developed techniques appropriate for the material to be deposited, including, but not limited to: chemical vapor deposition (CVD), low-pressure CVD (LPCVD), plasma-enhanced CVD (PECVD), semi-atmosphere CVD (SACVD), high density plasma CVD (HD-PCVD), rapid thermal CVD (RTCVD), ultra-high vacuum CVD (UHVCVD), limited reaction processing CVD (LR-PCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation. Any references to "poly," "polysilicon" or "poly Si" should be understood to refer to polycrystalline silicon.

It is noted that one of ordinary skill in the art will appreciate the various techniques and materials available for usage in conjunction with the above-described exemplary embodiments of the invention. For example, one of ordinary skill in the art will appreciate the various techniques and materials available to perform the steps and form the structures illustrated in FIGS. 1-10.

While described herein in relation to a layer of BOX, the exemplary embodiments are not limited thereto and may be used in conjunction with any suitable layer of insulating material. Furthermore, while described herein in relation to one or more transistors, the exemplary embodiments are not limited thereto and may be used in conjunction any suitable electronic device or structure.

While described above at least partly in relation to thin SOI devices and structures, the exemplary embodiments are not limited thereto and may be used in conjunction with any suitable substrate, including PDSOI, FDSOI or bulk, as non-limiting examples. Furthermore, the choice of substrate may be influenced or affected by one or more design considerations, such as reduction in resistance and/or reduction in leakage current, as non-limiting examples. Additional non-limiting examples of possible substrates include Si, Ge, SiGe, III-V and SOI.

Any use of the terms "connected," "coupled" or variants thereof should be interpreted to indicate any such connection or coupling, direct or indirect, between the identified elements. As a non-limiting example, one or more intermediate elements may be present between the "coupled" elements. The connection or coupling between the identified elements may be, as non-limiting examples, physical, electrical, magnetic, logical or any suitable combination thereof in accordance with the described exemplary embodiments. As non-limiting examples, the connection or coupling may comprise one or more printed electrical connections, wires, cables, mediums or any suitable combination thereof.

Generally, various exemplary embodiments of the invention can be implemented in different mediums, such as software, hardware, logic, special purpose circuits or any combination thereof. As a non-limiting example, some aspects may be implemented in software which may be run on a computing device, while other aspects may be implemented in hardware.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. However, all such and similar modifications will still fall within the scope of the teachings of the exemplary embodiments of the invention.

Furthermore, some of the features of the preferred embodiments of this invention could be used to advantage without the corresponding use of other features. As such, the foregoing description should be considered as merely illustrative of the principles of the invention, and not in limitation thereof.

What is claimed is:

1. A semiconductor structure comprising:
a substrate having a surface; and
a plurality of gate structure devices at least partially overlying the substrate, where the plurality of gate structure devices comprises a first gate structure device and a second gate structure device defining a gate-to-gate spacing therebetween, the first gate structure device coupled to the second gate structure device via a first raised source/drain formed in a gate-to-gate source/drain area defined by the gate-to-gate spacing and having a first length determined by a minimum gate-to-gate source/drain area operable to minimize parasitic capacitance associated with the first gate structure device and the second gate structure device and having a first height, where the first gate structure device is further coupled to a second raised source/drain having a second length and a second height, where the first gate structure device comprises a transistor, where the first raised source/drain and the second raised source/drain at least partially overlie the surface of the substrate by said first height and said second height, respectively, where the second raised source/drain comprises a terminal electrical contact, where the second length is greater than the first length so that the second raised source/drain having the relatively greater second length is effective for providing the terminal electrical contact, and the second height is greater than the first height, where the first raised source/drain and the second raised source/drain comprise a faceted epitaxy structure having a generally triangle-shaped cross section, and the faceted epitaxy structure of the second raised source/drain is larger than the faceted epitaxy structure of the first raised source/drain.

2. The semiconductor structure of claim 1, where the first gate structure device comprises a field effect transistor.

3. The semiconductor structure of claim 1, where the second gate structure device comprises a second transistor, a second field effect transistor, a passive device, a capacitor or a resistor.

4. The semiconductor structure of claim 1, where the second gate structure device is further coupled to a third gate structure device via a third raised source/drain having a third length, where the second length is greater than the third length.

5. The semiconductor structure of claim 1, where the first length is about 15 nm and the second length is about 30 nm.

6. The semiconductor structure of claim 1, where at least one of the first raised source/drain and the second raised source/drain comprises a generally triangular cross-section.

7. The semiconductor structure of claim 1, where the first raised source/drain is not operable to connect to a further device or component.

8. The semiconductor structure of claim 1, where the gate-to-gate spacing for at least two devices of the plurality of devices is less than a length of at least one contact area on the semiconductor structure.

9. The semiconductor structure of claim 1, where the semiconductor structure comprises a NAND gate.

10. The semiconductor structure of claim 1, where the substrate comprises a silicon-on-insulator, a thin silicon-on-insulator, a partially depleted silicon-on-insulator, a fully depleted silicon-on-insulator or a bulk substrate.

11. The semiconductor structure of claim 1, where at least one of the first raised source/drain and the second raised source/drain has a trapezoidal cross-section.

12. A semiconductor structure, comprising:
a substrate having a surface; and
a plurality of gate structure devices at least partially overlying the substrate, where the plurality of gate structure devices comprises a first gate structure device and a second gate structure device defining a gate-to-gate spacing therebetween, where the first gate structure device comprises a transistor; and
a first raised source/drain in a gate-to-gate source/drain area defined by the gate-to-gate spacing and a second raised source/drain, where the first raised source/drain and the second raised source/drain at least partially overly the substrate, where the first gate-structure device is connected to the second gate structure device via the first raised source/drain, where the first gate structure device is further coupled to the second raised source/drain, where the first raised source/drain has a first length and the second raised source/drain has a second length, where the second raised source/drain comprises a terminal electrical contact, where the second length is greater than the first length so that the second raised source/drain having the relatively greater second length is effective for providing the terminal electrical contact, where the first raised source/drain and the second raised source/drain comprise a faceted epitaxy having a generally triangle-shaped cross section, and the faceted epitaxy structure of the second raised source/drain is larger than the faceted epitaxy structure of the first raised source/drain.

13. The semiconductor structure of claim 12, further comprising: silicide formed over at least the second raised source/drain.

14. The semiconductor structure of claim 12, further comprising: a double spacer formed around the first gate structure device.

15. The semiconductor structure of claim 12, further comprising: a contact formed at the second raised source/drain.

16. The semiconductor structure of claim 12, where the first length is on the order of 15 nm and the second length is on the order of 30 nm.

17. The semiconductor structure of claim 12, where the ratio of the second length to the first length is substantially 2:1.

* * * * *